(12) United States Patent
Talaga, Jr.

(10) Patent No.: US 6,232,844 B1
(45) Date of Patent: May 15, 2001

(54) CONTROLLED ORTHOGONAL CURRENT OSCILLATOR WITH RANGING

(75) Inventor: Ronald F. Talaga, Jr., Lake Oswego, OR (US)

(73) Assignee: Vitesse Semiconductor Corporation, Camarillo, CA (US)

( * ) Notice: Subject to any disclaimer, the term of this patent is extended or adjusted under 35 U.S.C. 154(b) by 0 days.

(21) Appl. No.: 09/322,738

(22) Filed: May 28, 1999

(51) Int. Cl.[7] .............................. H03B 5/24; H03B 5/12; H03L 7/099
(52) U.S. Cl. .............................. 331/57; 331/34; 331/172; 331/179
(58) Field of Search .............................. 331/34, 1 R, 57, 331/17, 116 R, 116 FE, 117 R, 117 FE, 117 D, 172–174, 177 R, 179

(56) References Cited

U.S. PATENT DOCUMENTS

| 4,706,045 | 11/1987 | Ouyang et al. ....................... 331/117 |
| 4,918,406 | * 4/1990 | Baumbach et al. ............... 331/117 R |
| 5,420,547 | * 5/1995 | Kikuchi ................................. 331/57 |
| 5,561,398 | * 10/1996 | Rasmussen ......................... 331/36 C |
| 5,561,399 | * 10/1996 | Haartsen ................................ 331/57 |
| 5,850,163 | 12/1998 | Drost et al. .......................... 331/115 |

OTHER PUBLICATIONS

Wei–Zen Chen et al., "A 2–V 2–GHz BJT Variable Frequency Oscillator", Article, Sep. 1998, pp. 1406–1410, vol. 33, No. 9, IEEE Journal of Solid–State Circuits, U.S.A.

* cited by examiner

*Primary Examiner*—Davis Mis
(74) *Attorney, Agent, or Firm*—Christie, Parker & Hale, LLP

(57) ABSTRACT

An adjustable frequency oscillator with a wide tuning range which can be voltage or current controlled. A maximum tuning per feedback current is obtained by phase shifting a feedback signal by approximately 90 degrees with respect to the oscillating output signal, which is internally generated by the adjustable frequency oscillator. Over the frequency range of operation, the oscillation frequency of the oscillating output signal is linearly controllable. The adjustable frequency oscillator is also implemented as a ring oscillator and/or an oscillator with ranging.

23 Claims, 10 Drawing Sheets

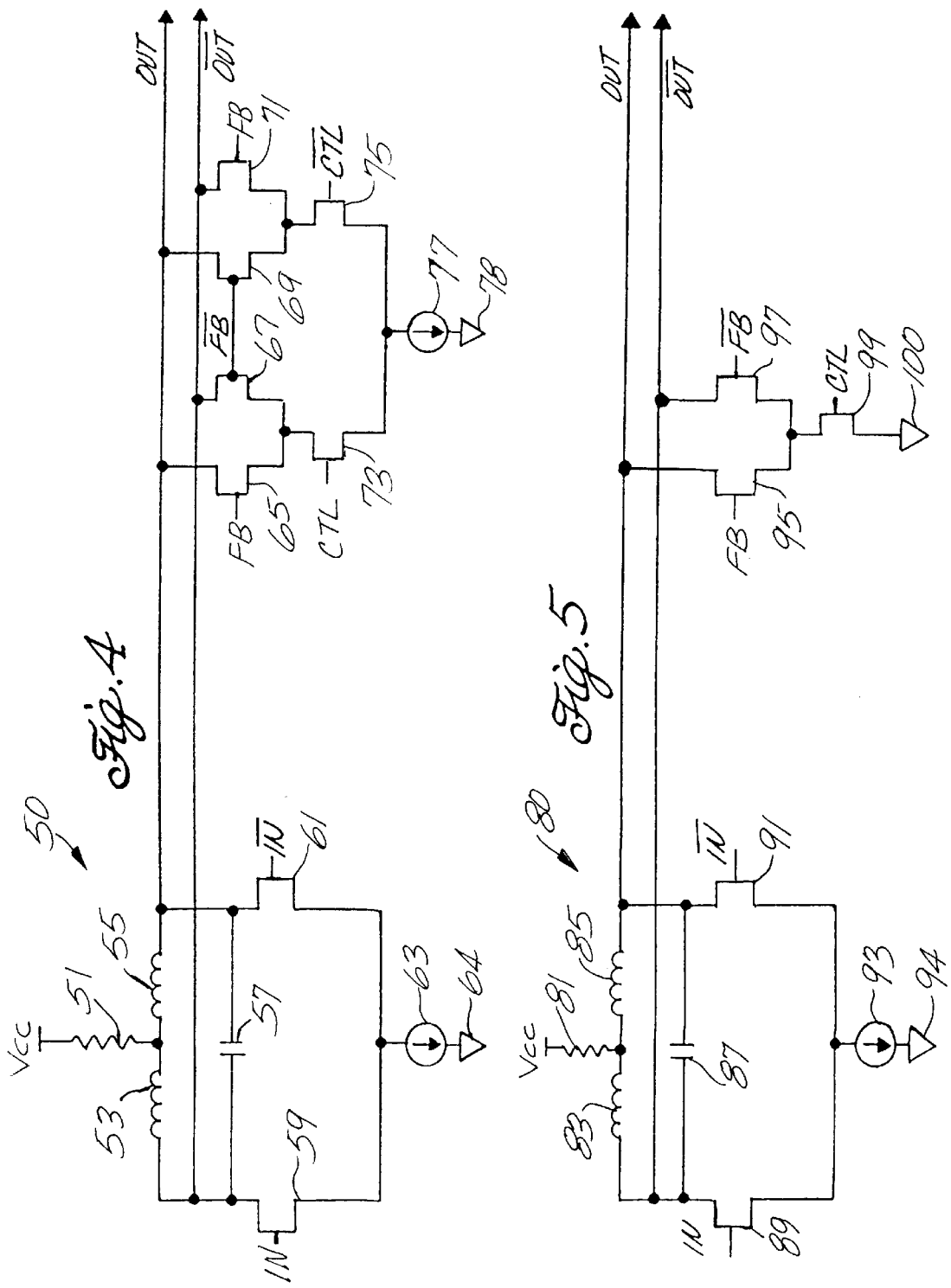

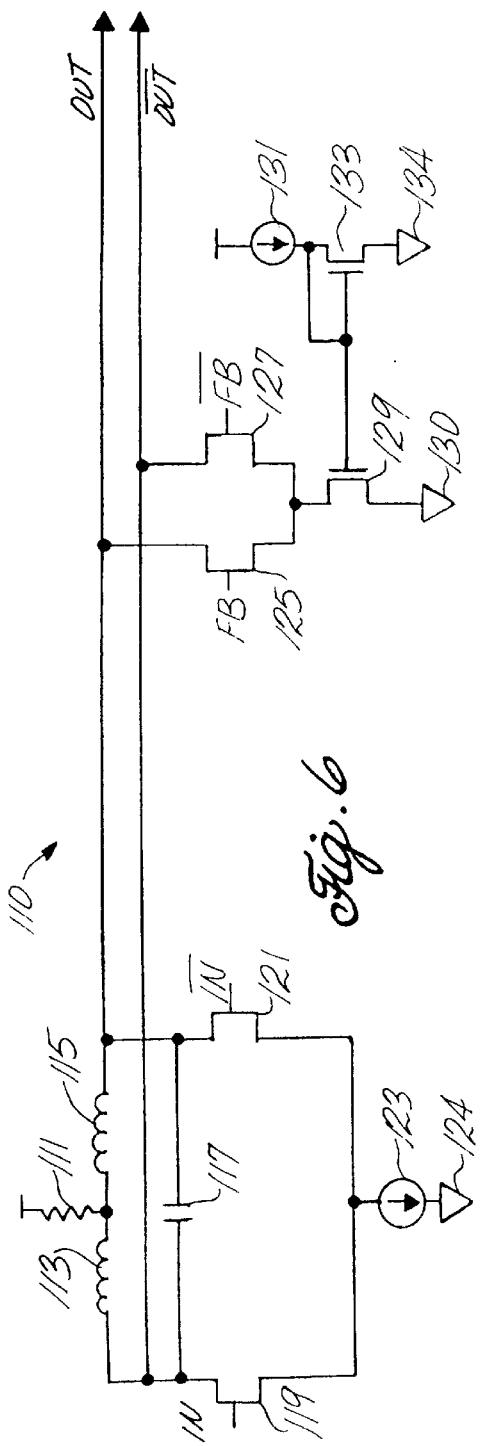
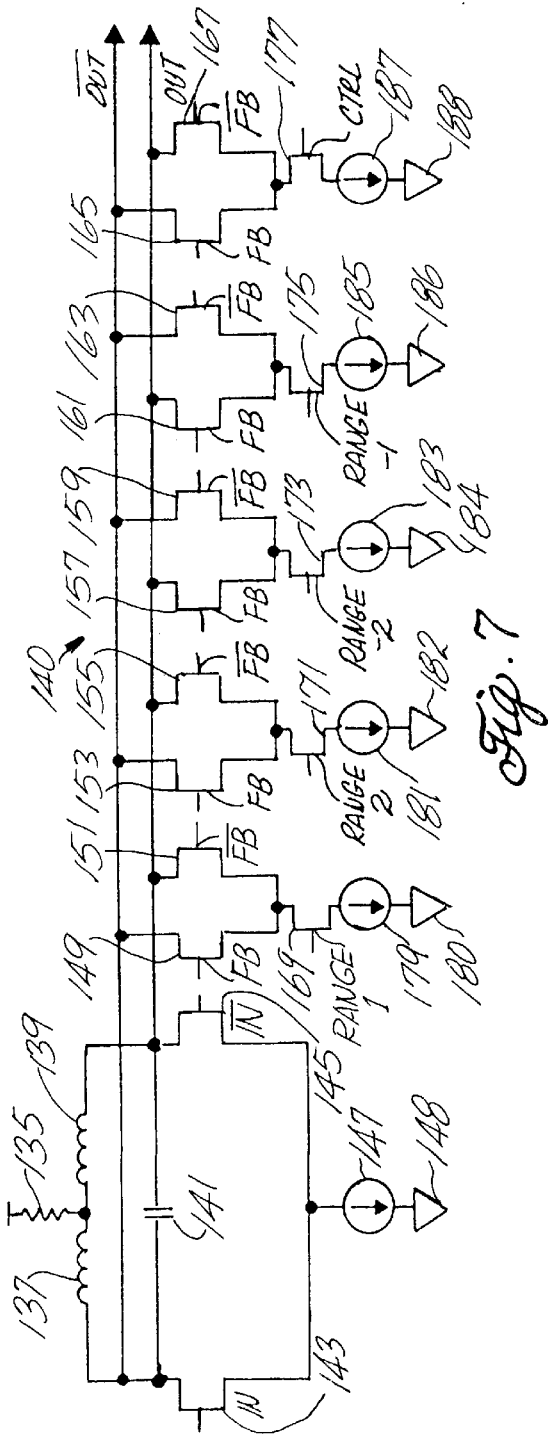

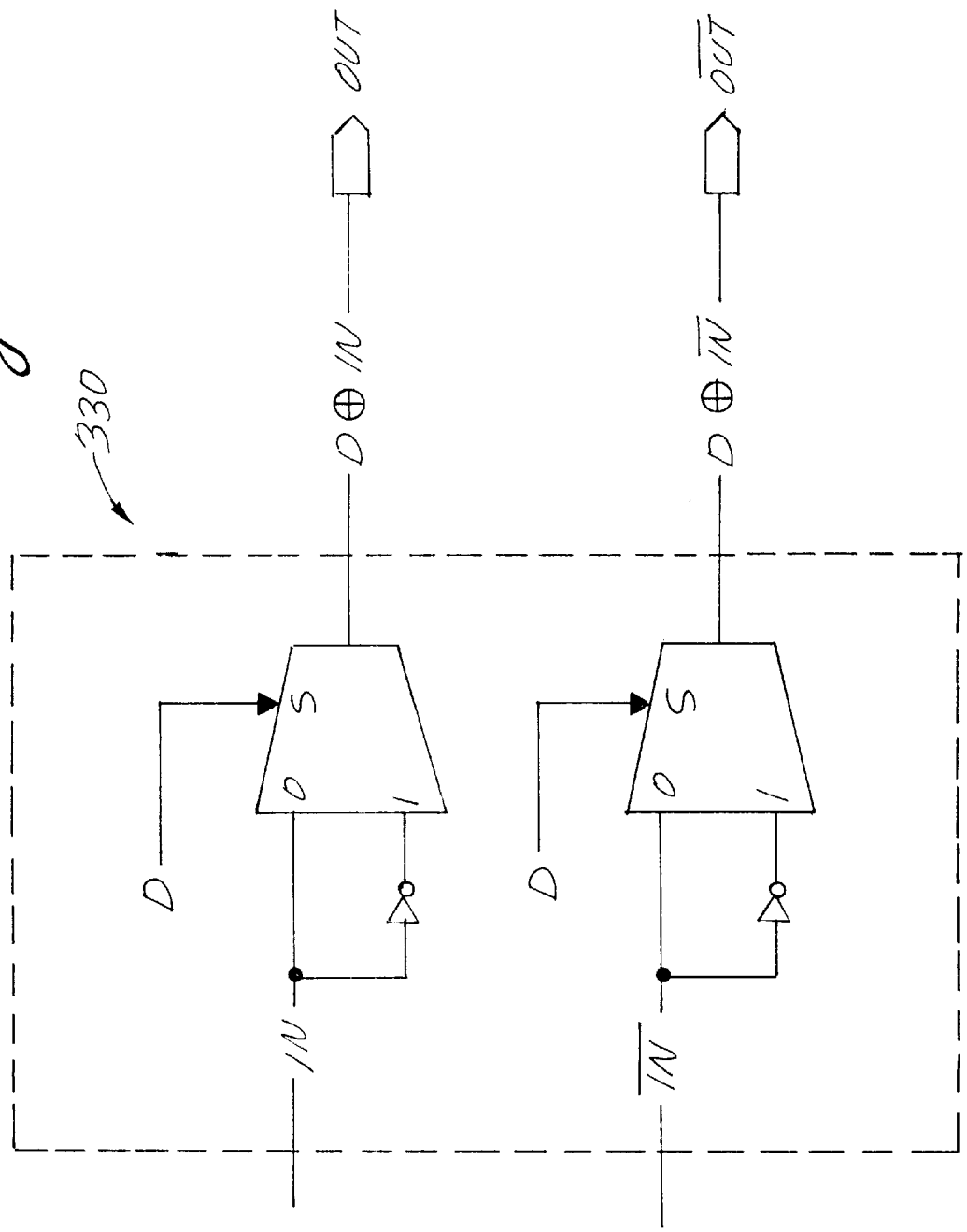

CONTROLLED ORTHOGONAL CURRENT OSCILLATOR WITH RANGING

BACKGROUND OF THE INVENTION

This invention relates generally to oscillators, and more particularly to an adjustable frequency oscillator.

Adjustable frequency oscillators are used in diverse applications. These applications include receivers, transmitters, data transmission lines, cellular phone systems, and optical and analog communication systems. Very often these applications include phase locked loops (PLLs). PLLs are often used to lock a local clock signal of a receiver to a clock signal of a transmitter. Adjustable frequency oscillators are used in PLLs to generate an adjustable clock signal.

Several architectures have been proposed for adjustable frequency oscillator designs. These architectures may largely be categorized as varactor-based oscillators, RC-tuned oscillators, interpolation oscillators, oscillators based on other variable elements, or resistor sensing oscillators. Each of the above categories of oscillators have several inherent shortcomings.

Perhaps the most widely used type of an oscillator is a varactor-based oscillator. A varactor based oscillator is an LC tank circuit with variable capacitance. The resonant frequency $\omega_n$ of an LC tank circuit is $1/\sqrt{LC}$. Therefore, by varying the capacitance C of an LC tank circuit, the resonant frequency may be varied. The capacitance is generally varied using a varactor. A varactor is an adjustable capacitor, and is often formed using a reverse-biased diode. A reverse-biased diode has a pn junction with an inherent capacitance. The inherent capacitance is related to the width of the depletion area of the pn junction, and this depletion area varies with the level of reverse-biasing. Accordingly, the inherent capacitance of the pn junction may be modified by changing the reverse bias of the diode.

Unfortunately, the capacitance of the reverse-biased pn junction is inherently non-linear, and exhibits somewhat linear behavior only over small voltage ranges. Therefore, a range of reverse-biasing voltages of the pn junction at which the capacitance varies in a linear manner must be determined for varactor applications. This limits the capacitance range of a varactor, and thus a range of oscillator frequency. Because of this limitation, in order to use the varactor-based oscillator over a wide range, some form of ranging with switching between a plurality of varactors is required to allow increased capacitance variation. This, however, occurs at the expense of increased circuit complexity.

In addition, a varactor has a capacitance proportional to the voltage across it. As the varactor charges up and down during oscillation, the voltage across the varactor changes, proportionately changing the capacitance of the varactor. Therefore, the resonant frequency of the oscillator changes as it oscillates. Furthermore, varactors are not a common element in many designs and therefore tend to be poorly modeled as compared with transistors.

One other disadvantage of a varactor-based oscillator is a non-linear frequency vs. voltage characteristic. Even if the capacitance C of a varactor is linearly proportional to the voltage across it, the oscillation frequency $\omega_n$ will be proportional to $1/\sqrt{V}$ since $\omega_n = 1/\sqrt{LC}$ and $C = C_0 + V \cdot K_{CV}$. This non-linearity can be a problem in PLL applications since most PLL models and equations are only valid for linear oscillators. One way to reduce this non-linearity problem is to apply a correction function to the voltage before the oscillator (for example, squaring and inverting V), but this further complicates the circuit and introduces other variables into the circuit. Another method of overcoming the non-linearity problem is to assume that over the range of V, $1/\sqrt{V}$ is approximately linearly proportional to V. This approximation, however, is only good for narrow ranges of V.

Another commonly used oscillator circuit is based on an RC-tuned circuit with an RC time constant. A voltage rise time and a fall time of a capacitor in an RC-circuit are related to the RC time constant, and therefore a rate of change of voltage across the capacitor, and thus a passband of an oscillating signal output of the oscillator circuit, is also related to the RC time constant. In a typical RC-tuned circuit, a variable resistor is used to vary the RC time constant. There are several types of RC-tuned circuits found in applications such as ring oscillators. The main disadvantage of RC-tuned circuits is that Q (Quality factor of resonance) is undefined for the RC-tuned circuits. Because of their lack of Q, RC-tuned circuits have higher phase noise, and are usually highly susceptible to power supply noise.

Sometimes two LC tank circuits with different oscillation frequencies are coupled together to form a single oscillator, thereby forming an interpolator. In interpolators the oscillation frequency of the oscillating signal output is varied by giving a different weight factor to the output of each LC tank circuit. Oscillators with an interpolator have a reasonable Q factor, but this Q factor changes quite a bit over frequency, and is also non-linear. If the output frequency of the interpolator is same as the resonant frequency of one of the two interpolated LC tanks, the Q is high. However, if the output frequency differs significantly from the resonant frequencies of both LC tanks, the Q decreases.

Another technique used for oscillator applications is the use of a variable impedance circuit (VIC) to change the value of a capacitor. This technique has several problems. First, the VIC is a tuned circuit itself, requiring design in which the tunable range matches the range of the oscillator. It also lowers the Q of the capacitor since it introduces real components to the current. This is highly undesirable since it then lowers the Q of the circuit.

A resistor sensing mechanism in resistor sensing oscillators places a resistor in series with either an inductor or a capacitor of an LC tank circuit. This mechanism takes advantage of the fact that ac currents tapped from two ends of the inductor or capacitor are out-of-phase with each other. This mechanism reduces Q (quality factor of resonance) of the oscillator enough to make it undesirable for integrated circuit applications.

SUMMARY OF THE INVENTION

The present invention is a controlled frequency oscillator with a wide tuning range which can be either voltage or current controlled, i.e., a voltage source or a current source may be used to supply an external input stimulus.

In one embodiment, the present invention comprises: an LC tank circuit with an inductive element and a capacitive element, a current source element coupled to the LC tank circuit, and a phase shifting element coupled to both the LC tank circuit and the current source element.

The controlled oscillator circuit receives the external input stimulus and generates an oscillating output signal. The phase shifting element controls a phase of a current flowing through the current source with respect to a phase of the oscillating output signal. Both the external stimulus and the oscillating output signal may be differential signals.

To maintain a high Q, it is preferable to keep the phase differential between the phase of the oscillating output signal and the phase of the current flowing through the current source by approximately 90 degrees. For approximately 90 degrees of phase shift, an integrator or a differentiator may be used. As well, a phase detector coupled to an RC circuit with a variable resistor may be used for tracking the phase shift and maintaining it at approximately 90 degrees.

Over a frequency range of operation of the controlled oscillator circuit, an oscillation frequency of the oscillating output signal is substantially linearly dependent on the current flowing through the current source element. Therefore, by using a gain-controllable current source as the current source element, the oscillation frequency of the oscillating output signal can be varied. The control signal for controlling gain may be single-ended or differential. A current mirror circuit may be used as well to control gain.

A ring oscillator with a plurality of oscillator stages and buffers may be used to implement another embodiment of the present invention. An oscillator with ranging, having a ranging element controlled by a plurality of control(range) signals, is yet another embodiment of the present invention. According to the present invention, principles of the ring oscillator and the oscillator with ranging are used together in one other embodiment, a ring oscillator with a plurality of oscillator stages with ranging and buffers. In a ring oscillator, buffers are not required. The buffers are used to make the phase delay around the loop the same as the frequency of the oscillator.

BRIEF DESCRIPTION OF THE DRAWINGS

FIG. 4 illustrates the oscillator of FIG. 1 with fully differential signals;

FIG. 5 illustrates the oscillator of FIG. 1 with a single ended control signal;

FIG. 6 illustrates a oscillator with current controlled feedback;

FIG. 7 illustrates an oscillator with ranging;

FIG. 12A illustrates the block diagram of the multiplexor (to implement XOR) circuit of the ranging circuit of FIG. 11;

DETAILED DESCRIPTION

Figure 1:
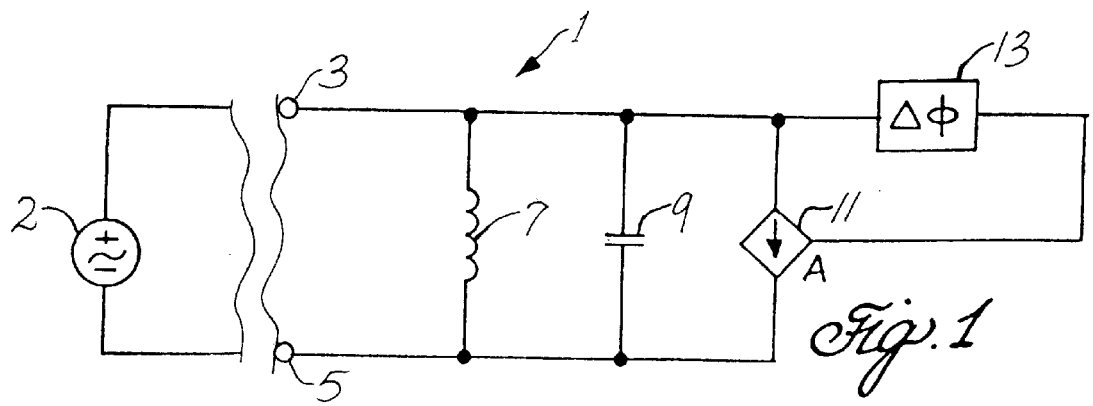
FIG. 1 illustrates a block diagram of an oscillator with a phase shifting element.

FIG. 1 illustrates a block diagram for a voltage controlled oscillator 1. The oscillator includes a phase shifting element 13. A voltage stimulus 2 provides an input stimulus across a positive input terminal 3 and a negative input terminal 5 of the oscillator. A first end of an inductor 7 is coupled to the positive input terminal 3, and a second end of the inductor 7 is coupled to the negative input terminal 5. A capacitor 9 is coupled in parallel to the inductor 7. The inductor 7 and the capacitor 9 comprise a resonant LC tank circuit, with the LC tank circuit having a resonant frequency. The resonant frequency of the LC tank circuit, without any other element, is $\omega_n = 1/\sqrt{LC}$.

A dependent current source 11 is coupled in parallel to the inductor 7 and the capacitor 9. The phase of the output from the dependent current source 11 is determined by a phase-shifted input from the phase shifting element 13. In the embodiment described, the phase of the current generated by the dependent current source 11 is controlled by the phase of the phase-shifted input signal. The magnitude of the output from the dependent current source 11 is controlled by a gain factor A, which may be positive or negative. Accordingly, a total current flowing from the positive terminal to the negative terminal has three components: an inductor current flowing through the inductor 7, a capacitor current flowing through the capacitor 9, and a dependent current through the dependent current source 11. The dependent current is phase shifted by $\phi$ degrees and has a gain A.

One consideration in an LC-type of oscillating circuit is a maintenance of high Q in a region of operation. A circuit with high Q tends to have a narrow passband at frequencies very close to the resonant frequency $\omega_0$, resulting in a narrow frequency spectrum in output signals. On the other hand, a circuit with a low Q tends to have a passband over a wider range of frequencies, resulting in a broader frequency spectrum in the output signals. Therefore, it is much more desirable to have a circuit with high Q in order to prevent noise in the oscillating output signal in potentially noise sensitive frequency bands.

Figure 13:
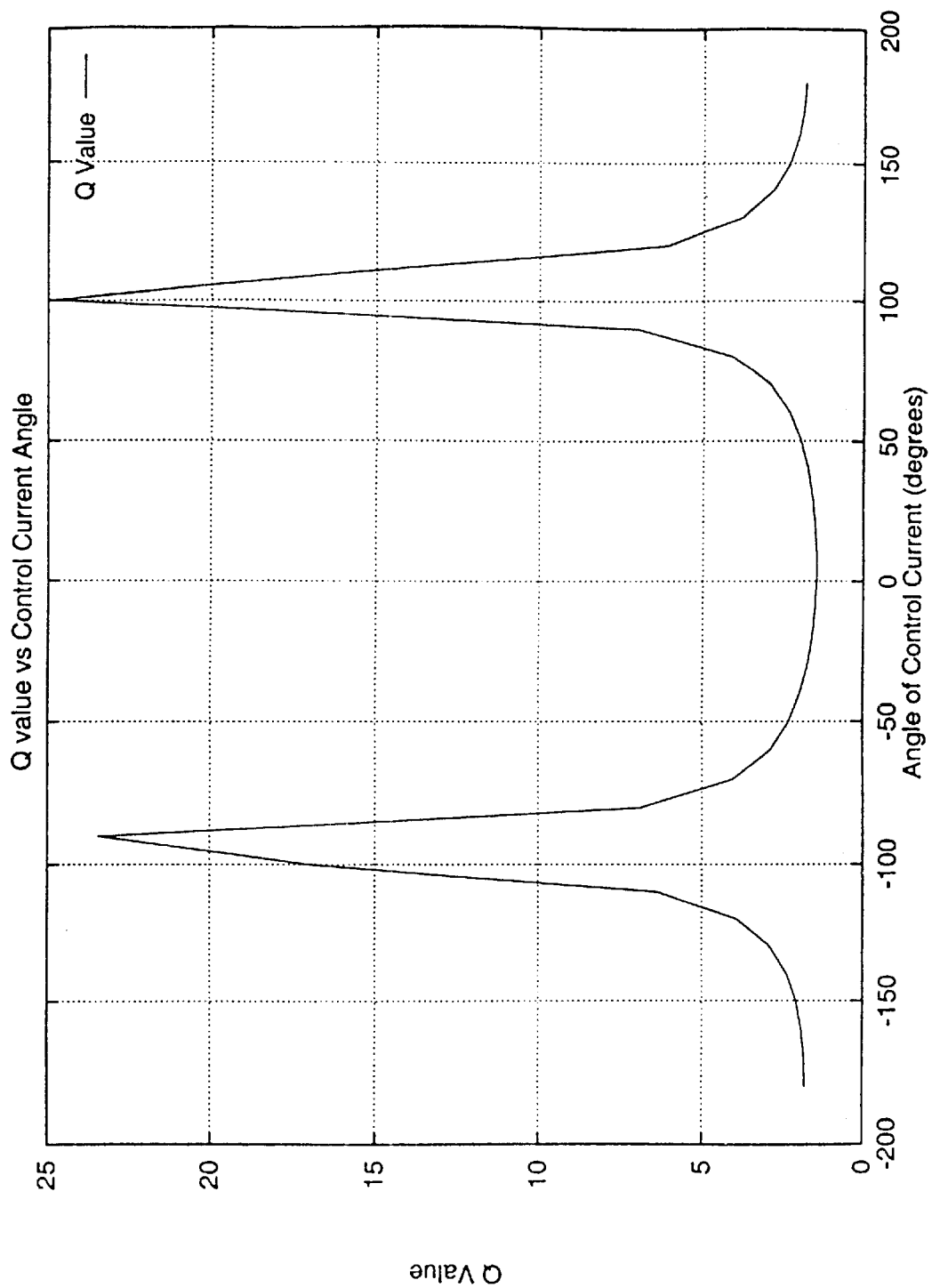
FIG. 13 illustrates a plot of a quality factor of resonance (Q) versus a control current angle ($\phi$).

For the circuit of FIG. 1, if a resistance R is placed in series with the inductor 7, the Q has been found empirically to have a form of $Q=1/((\omega_n/\omega_0)R(\omega_0 C + A \sin(\phi)) + \omega_0 L \cos(\phi))$. A resistor to represent the resistance R is not used in the present invention, however, since R tends to lower Q, as can be seen from the above equation. FIG. 13 shows a plot of Q versus the control current angle (phase shift $\phi$).

Currents flowing in the voltage controlled oscillator 1 of FIG. 1 may be characterized by $\omega_0^2 LC + \omega_0 LA\sin(\phi) - 1 = 0$, with $\omega_0$ the resonant frequency of the oscillator circuit. For the embodiment described, $\omega_0$ has the value of $\omega_0 = -Z + \sqrt{(Z^2 + \omega_n^2)}$ where $Z = A\sin(\phi)/2C$ and $\phi_n = 1/\sqrt{LC}$. Since changes in $\omega_0$ are proportional to $A\sin(\phi)$, the tuning of $\omega_0$ per dependent current is maximized when $|\sin(\phi)|$ reaches maxima at $\phi = \pm pi/2$. When $\phi = +pi/2$ or $-pi/2$, $\omega_0 \pm A/2C + \sqrt{(A^2/4C^2 + \omega_n^2)}$ For A near 0, i.e., $A^2/(4C^2) << \omega_n^2$, the above equation reduces to $\omega_0 \cong \pm A/2C + \phi_n$, and therefore, when the phase shift is substantially fixed at $\phi \cong \pm pi/2$, the resonant frequency of the oscillator is substantially linear with respect to the gain A with a maximum tuning. Therefore, with the gain A, an oscillation frequency of an internally generated oscillating output signal of the adjustable frequency oscillator may be linearly adjusted. When $\phi$ is set at approximately +pi/2 or -pi/2, $Q = 1/[(\omega_n/\omega_0)R(\omega_0 C + A)]$, with A either positive or negative, and Q stays high as illustrated in FIG. 13.

In one embodiment of the present invention, therefore, the phase shift $\phi$ for the oscillator of FIG. 1 is fixed at approximately +pi/2 or -pi/2. In one configuration of said embodiment, therefore, a differentiator, which shifts phase by approximately +pi/2, is the phase shifting element. In another configuration of said embodiment, an integrator, which shifts phase by approximately −pi/2, is the phase shifting element.

Figure 2:
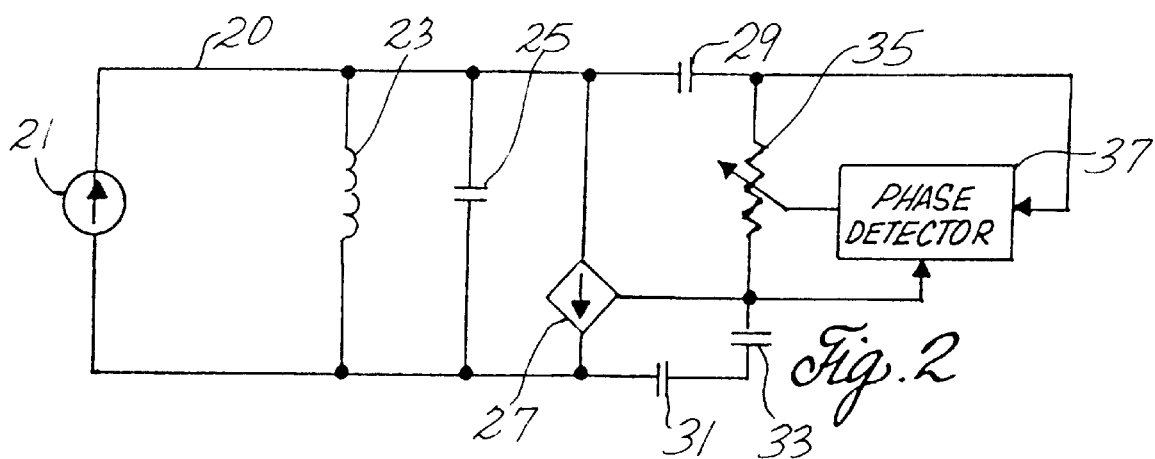
FIG. 2 illustrates a block diagram for an oscillator with an active feedback loop.

FIG. 2 illustrates an oscillator 20 with an active feedback loop. An input stimulus 21 provides an input signal. An inductor 23 and a capacitor 25 comprise an LC tank circuit with a resonant frequency, $\omega_n = 1/\sqrt{LC}$. A phase detector 37 detects a phase differential between an oscillation frequency of an internally generated oscillating output signal of the oscillator 20 and an output of a dependent current source 27. The phase detector 37 may be any one of commonly available phase detectors that produces an output voltage proportional to a phase differential between two signals. The output voltage from the phase detector is used to adjust a variable resistor 35 to change a RC time constant of an RC tuned circuit formed by the variable resistor 35 and a capacitor 33. The variable resistor 35 preferably is voltage controlled. A voltage controlled variable resistor may be an FET.

The RC tuned circuit is used to adjust a phase of an output of the dependent current source 27 to remain at ϕ, with ϕ approximately equal ±pi/2 in the described embodiment, with respect to a phase of the oscillating output signal of the oscillator 20. Capacitors 29 and 31 are used for ac coupling of the RC circuit with the LC tank circuit, and allows for measuring the phase differential between the internally generated oscillating output signal of the oscillator 20 and the output of the dependent current source 27 while providing a dc isolation between the LC tank circuit and the phase detector/RC-tuned circuit to prevent the latter from affecting an inherent transfer function of the oscillator 20.

Figure 3:
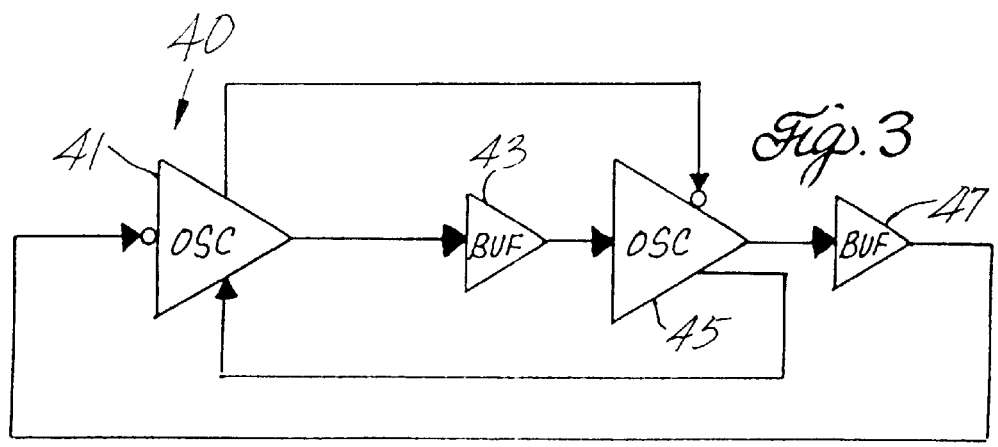
FIG. 3 illustrates a block diagram of a two stage ring oscillator with a phase differential of approximately 90 degrees between input signals and feedback signals at each oscillator stage.

FIG. 3 illustrates a block diagram of a ring oscillator 40 of the present invention. This ring oscillator comprises two oscillator stages 41 and 45, and two buffers 43 and 47. Two pairs of differential output signals of the oscillator stage 41 are supplied as an input to the buffer 43, and as an inverted feedback to the oscillator stage 45, respectively. A pair of differential output signals of the buffer 43, in turn, is supplied as inputs to the oscillator stage 45. Two pairs of differential output signals of the oscillator stage 45, in turn, are supplied to the buffer 47 as an input and as a feedback into the oscillator stage 41, respectively. Finally, to complete the ring, the differential output of the buffer 47 is supplied to the oscillator stage 41 as an inverted input. This is one embodiment of the ring oscillator. A ring oscillator can have any number of oscillator stages. In an embodiment of the present invention, a phase differential of approximately 90 degrees between the input signals and the feedback signals is maintained at each oscillator stage.

Figure 8:
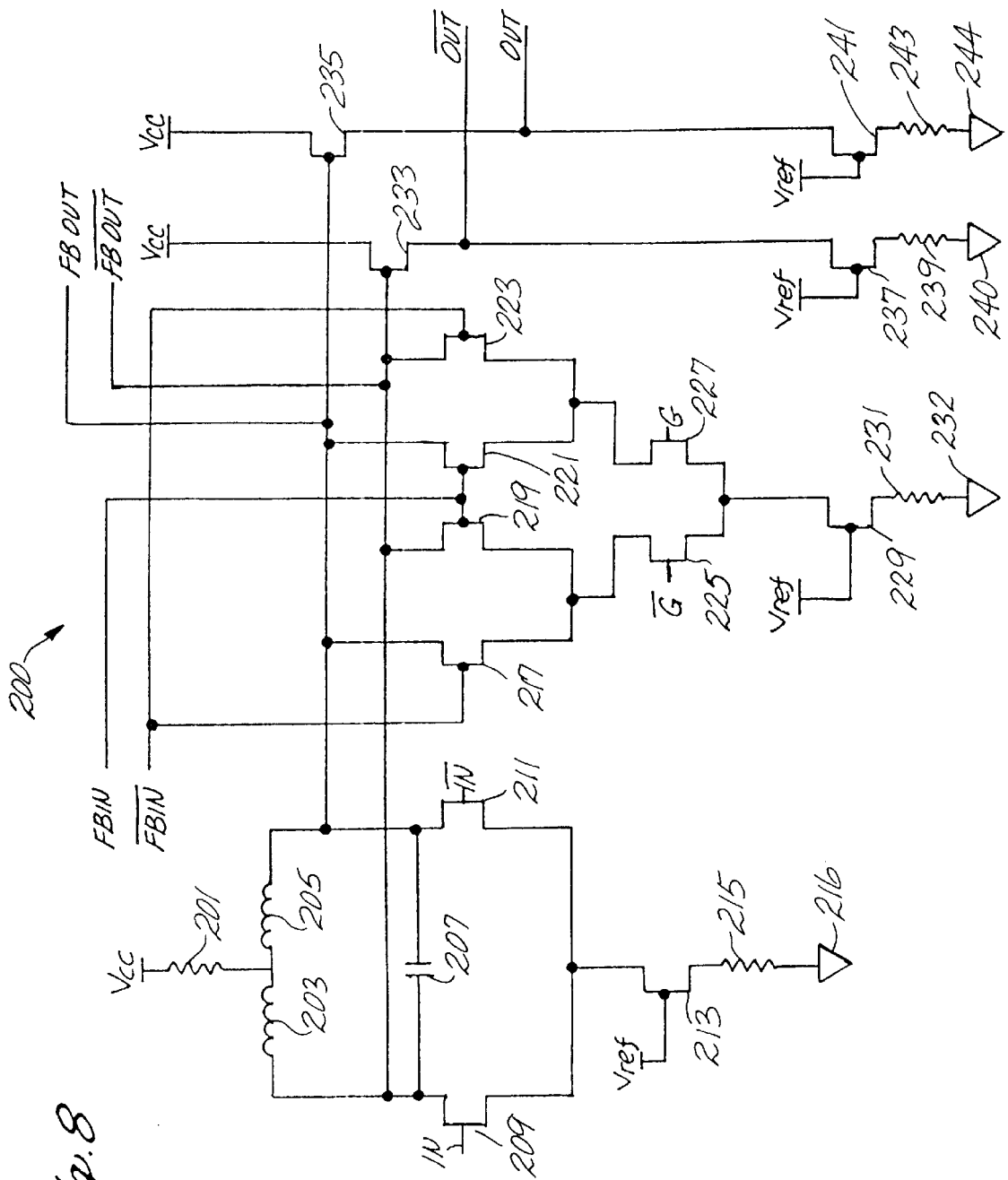
FIG. 8 illustrates an oscillator stage of the ring oscillator of FIG. 3.

FIG. 8 illustrates an oscillator stage of the ring oscillator of FIG. 3. A first end of a resistor 201 is coupled to Vcc. A second end of the resistor 201 is coupled to first ends of inductors 203 and 205. A second end of the first inductor 203 is coupled to a first end of a capacitor 207, and a second end of the second inductor 205 is coupled to a second end of the capacitor 207. The inductors 203, 205 and the capacitor 207 comprise an LC tank circuit.

The resistor 201 coupled between the LC tank circuit and Vcc is a biasing resistor for bringing down the reference voltage of operation of the LC tank circuit to below Vcc, shifting a common-mode operation voltage. The second ends of the inductors 205 and 203 provide a pair of differential output feedback signals, an FB OUT signal and an $\overline{\text{FB OUT}}$ signal, respectively. At the same time, the second ends of the inductors 205 and 203 are coupled to gates of transistors 235 and 233, respectively, as well. The second ends of the inductors 203 and 205 are also coupled to drains of transistors 209 and 211, respectively.

Gates of the transistors 209 and 211 are used to input a pair of differential input signals, IN and $\overline{\text{IN}}$, respectively. IN and $\overline{\text{IN}}$ are external input stimulus to the oscillator. Sources of the transistors 209 and 211 are coupled to a drain of a transistor 213. A gate of the transistor 213 is coupled to a reference voltage, $V_{REF}$. A source of the transistor 213 is coupled to a first end of a resistor 215. A second end of the resistor 215 is coupled to a common 216.

The transistor 213 and the resistor 215 operate as a current source, and a current $I_{DS}$ flowing through the transistor 213 is controlled by $V_{REF}$ and the value of the resistor 215. Therefore, if $V_{REF}$ remains fixed, the current flowing through the transistor 213 and the resistor 215 is substantially constant at all times of operation. Accordingly, the differential input signals, IN and $\overline{\text{IN}}$, applied. at the gates of the transistors 209 and 211 ,respectively, determine the ratio of $I_{DS}$ currents flowing respectively through transistor 209 and transistor 211.

Drains of transistors 217 and 221 are coupled to the FB OUT signal, and drains of transistors 219 and 223 are coupled to the $\overline{\text{FB OUT}}$ signal. A pair of differential signals, the FB OUT signal and the $\overline{\text{FB OUT}}$ signal, are fed into another oscillator stage of the ring oscillator in FIG. 3 as a pair of differential feedback input signals. The FB OUT signal and the $\overline{\text{FB OUT}}$ signal can be AC-coupled, and such AC-coupling lowers the capacitance on the tank nodes.

Gates of the transistors 217 and 223 are coupled to an $\overline{\text{FB IN}}$ signal, and gates of the transistors 219 and 221 are coupled to an FB IN signal. This pair of differential feedback signals, $\overline{\text{FB IN}}$ and FB IN, are from said another oscillator stage. Sources of the transistors 217 and 219 are coupled to a drain of a transistor 225. Sources of the transistors 221 and 223 are coupled to a drain of a transistor 227. Gates of the transistors 225 and 227 receive input from a pair of differential gain signals, $\overline{G}$ and G, respectively.

Sources of the transistors 225 and 227 are coupled to a drain of the transistor 229. A gate of the transistor 229 is coupled to the reference voltage, $V_{REF}$. A source of the transistor 229 is coupled to a first end of a resistor 231. A second end of the resistor 231 is coupled to a common 232. The sources of the transistors 225 and 227 can be degenerated, i.e., a resistor can be placed between the source of the transistor 225 and the drain of the transistor 229 and between the source of the transistor 227 and the drain of the transistor 229. The source degeneration will have an effect of linearizing the tuning port.

The transistors 217, 219, 221 and 223 are used to supply the differential feedback signals as input into the oscillator stage circuit 200. The differential feedback signals are generated by said another oscillator stage of the ring oscillator in FIG. 3. An amplitude of a current through the resistor 231 is dependent on the differential pair of gain signals, $\overline{G}$ and G, applied respectively at the gates of the transistors 225 and 227, as well as $V_{REF}$ and a resistive value of the resistor 231.

Drains of the transistors 233 and 235 are coupled to Vcc. Sources of the transistors 233 and 235 provide a pair of differential output signals, $\overline{\text{OUT}}$ and OUT, respectively. The pair of the differential output signals are input into a buffer of FIG. 3.

The sources of the transistors 233 and 235 are also coupled to drains of transistors 237 and 241, respectively. Gates of the transistors 237 and 241 are coupled to $V_{REF}$. Sources of the transistors 237 and 241 are coupled to first ends of resistors 239 and 243, respectively. Second ends of the resistors 239 and 243 are coupled to common 240 and 244, respectively.

FIG. 4 illustrates a voltage controlled, fully differential oscillator 50. A first inductor 53, a second inductor 55 and a capacitor 57 comprise an LC tank circuit, identical to the LC tank circuit of FIG. 8. The biasing resistor 51 is analogous to the biasing resistor 201 of FIG. 8. The second ends of the inductors 55 and 53 provide a pair of differential output signals of the oscillator circuit 50, OUT and an $\overline{\text{OUT}}$, respectively.

Transistors 59 and 61 are coupled to the LC tank circuit, and their gates receive IN and $\overline{\text{IN}}$ signals, in an identical manner as the transistors 209 and 211 of FIG. 8. Sources of the transistors 59 and 61 are coupled to a first end of an independent current source 63. A second end of the independent current source 63 is coupled to a common 64. The independent current source 63 has a substantially fixed current across it at all times of operation.

Since the current flowing through the independent current source 63 is substantially constant, a sum of a current flowing through the transistor 59 and a current flowing through the transistor 61 is substantially fixed as well. Therefore, the differential signals IN and $\overline{\text{IN}}$ applied at the gates of transistors 59 and 61 respectively, determine the ratio of $I_{DS}$ currents flowing respectively through transistor 59 and transistor 61.

Drains of transistors 65 and 69 are coupled to the second end of the second inductor 55, which provides an output signal, OUT, of the oscillator 50, and drains of transistors 67 and 71 are coupled to the second end of the first inductor 53, which provides an inverted output signal, $\overline{\text{OUT}}$, of the oscillator 50. The transistors 65, 67, 69, and 71 are used to supply the differential feedback signals, FB and $\overline{\text{FB}}$, as inputs into the oscillator circuit 50. Gates of the transistors 67 and 69 are coupled to an $\overline{\text{FB}}$ signal, and gates of the transistors 65 and 71 are coupled to an FB signal. The differential feedback signals are generated by a phase shifting element (not shown), and are phase shifted by φ degrees with respect to the output signals. In one embodiment of the present invention, φ is set at approximately ±pi/2.

Sources of the transistors 65 and 67 are coupled to a drain of a transistor 73. Sources of the transistors 69 and 71 are coupled to a drain of a transistor 75. Gates of the transistors 73 and 75 receive as inputs a pair of differential control signals, CTL and $\overline{\text{CTL}}$, respectively. Amplitudes of currents through the transistors 73 and 75 are dependent on the pair of differential control signals, CTL and $\overline{\text{CTL}}$, respectively.

Sources of the transistors 73 and 75 are coupled to a first end of a current source 77. A second end of the current source 77 is coupled to a common 78. An oscillation frequency of the differential output signals of the oscillator circuit 50 is substantially linearly dependent on the magnitude of the control signals when $A^2/4C^2 << \omega_n^2$. A is a gain controlled by the control signals and $\omega_n$ is the resonant frequency of the LC tank circuit, $\omega_n = 1/\sqrt{LC}$.

FIG. 5 illustrates a single ended voltage controlled oscillator 80. The operation of the oscillator 80 is similar to that of the fully differential oscillator 50 of FIG. 4. A difference is that the control signal is single ended, whereas the control signals are differential in the fully differential oscillator 50.

In the oscillator circuit 80 of FIG. 5, a biasing resistor 81, an LC tank circuit having first and second inductors 83, 85 and a capacitor 87, transistors 89 and 91 receiving IN and $\overline{\text{IN}}$ signals, a current source 93, and a common 94 are configured identically to the corresponding elements of the fully differential oscillator circuit of FIG. 4.

A drain of a transistor 95 is coupled to a second end of the second inductor 85, and a drain of a transistor 97 is coupled to a second end of the first inductor 83. Gates of the transistors 95 and 97 are coupled to a pair of differential feedback signals, an FB signal and an $\overline{\text{FB}}$ signal, respectively. The differential feedback signals are generated by a phase shifting element (not shown) with identical characteristics as the phase shifting element of FIG. 4.

Sources of the transistors 95 and 97 are coupled to a drain of a transistor 99. A gate of the transistor 99 receives an input of a control signal. A source of the transistor 99 is coupled to a common 100. An amplitude of a current through the transistor 99 is dependent on a magnitude of the control signal. An oscillation frequency of differential output signals of the oscillator circuit 80 is substantially linearly dependent on the amplitude of the current through the transistor 99, and therefore the magnitude of the control signal, similarly to the fully differential oscillator 50 of FIG. 4.

FIG. 6 illustrates a single ended oscillator with current controlled feedback 110. The operation of this oscillator 110 is similar to that of the fully differential oscillator 50 of FIG. 4. A difference is that a gain of a feedback current is controlled by a current mirror circuit, rather than the fully differential control signals of the fully differential oscillator 50.

In the oscillator circuit 110 of FIG. 6, a biasing resistor 111, an LC tank circuit having first and second inductors 113, 115 and a capacitor 117, transistors 119 and 121 receiving IN and $\overline{\text{IN}}$ signals, a current source 123 and a common 124 are configured identically to the corresponding elements of the fully differential oscillator circuit of FIG. 4. Transistors 125 and 127 receiving differential feedback signals FB and $\overline{\text{FB}}$ are configured identically to corresponding elements of the single ended voltage controlled oscillator of FIG. 5.

Sources of the transistors 125 and 127 are coupled to a drain of a transistor 129. A source of the transistor 129 is coupled to a common 130. A gate of the transistor 129 is coupled to both a gate and a drain of a transistor 133 as well as a second end of a current source 131. A first end of the current source 131 is coupled to a voltage source. A source of the transistor 133 is coupled to a common 134.

The transistors 129, 133, and the current source 131 comprise the current mirror circuit, where a ratio between a current flowing through the transistor 129 and a current flowing through the transistor 133 is fixed, depending only on a ratio of their respective dimensions. The current flowing through the transistor 133 is identical to the current flowing through the current source 131. Therefore, by varying a magnitude of the current supplied by the current source 131, a magnitude of the current flowing through the transistor 129 can be varied proportionately. The current flowing through the transistor 129 is controlled by the current source 131. The feedback signals, FB and $\overline{\text{FB}}$, respectively applied to the gates of the transistors 125 and 127, proportionately divide the current flowing through the transistor 129 between the transistors 125 and 127.

FIG. 7 illustrates an oscillator with ranging 140. The operation of this oscillator with ranging 140 is similar to the fully differential oscillator 50 of FIG. 4. A difference is that the oscillator with ranging 140 provides for varying a magnitude of a feedback current with a plurality of control (range) signals, each of which may be used independently to control the magnitude of all or a portion of the feedback current. The oscillator with ranging, however, retains a capability to operate in a manner similar to the single ended voltage controlled oscillator 80 of FIG. 5.

In the oscillator with ranging 140 of FIG. 7, a biasing resistor 135, a tank circuit having first and second inductors 137, 139 and a capacitor 141, transistors 143 and 145 receiving IN and $\overline{\text{IN}}$ signals, current source 147 and a common 148 are configured identically to the corresponding elements of the fully differential oscillator circuit of FIG. 4.

Drains of transistors 149, 153, 159, 163 and 165 are coupled to an $\overline{\text{OUT}}$ signal from a second end of the first inductor 137. Drains of transistors 151, 155, 157, 161 and 167 are coupled to an OUT signal from a second end of the second inductor 139. Gates of the transistors 149, 153, 157, 161, and 165 receive input from an FB signal which is one of a pair of differential feedback signals. Gates of the transistors 151, 155, 159, 163, and 167 receive input from an $\overline{\text{FB}}$ signal, which is the other one of the pair of differential feedback signals. The differential feedback signals are generated by a phase shifting element (not shown), and are phase shifted by φ degrees with respect to the output signals.

Sources of the transistors 149 and 151 are coupled to a drain of a transistor 169. A gate of the transistor 169 receives an input of a range 1 signal. A source of the transistor 169 is coupled to a first end of an independent current source 179. A second end of the independent current source 179 is coupled to a common 180.

The transistors 153, 155, a transistor 171 receiving a range 2 signal, an independent current source 181 and a common 182 are configured identically to the corresponding elements for the range 1 signal. The transistors 157, 159, a transistor 173 receiving a range −2 signal, an independent current source 183 and a common 184 are configured identically to the corresponding elements for the range 1 signal. The transistors 161, 163, a transistor 175 receiving a range −1 signal, an independent current source 185 and a common 186 are configured identically to the corresponding elements for the range 1 signal. The transistors 165, 167, a transistor 177 receiving a control signal, CTRL, an independent current source 187 and a common 188 are configured identically to the corresponding elements for the range 1 signal.

The independent current sources 179, 181, 183 and 185 have substantially constant current flowing through them as long as the respective transistors 179, 181, 183 and 185 are turned on. The range signals 1, 2, −2 and −1 are digital or analog signals which turn the transistors 179, 181, 183 and 185 on and off, respectively. Depending on a control system implemented, the range signals may activate the transistors 169, 171, 173 and 175 one at a time or in any combination. The oscillator circuit with ranging may be used in an identical manner as the single ended voltage controlled oscillator 80 of FIG. 5 by disabling ranging, and using the transistors 165, 167 and 177 and the FB, the $\overline{\text{FB}}$ and the CTRL signals. FIG. 7 is just an embodiment of an oscillator circuit with ranging. Additional range signals, and corresponding circuit elements to incorporate additional range signals into the oscillator circuit, may be used as well.

Figure 9:
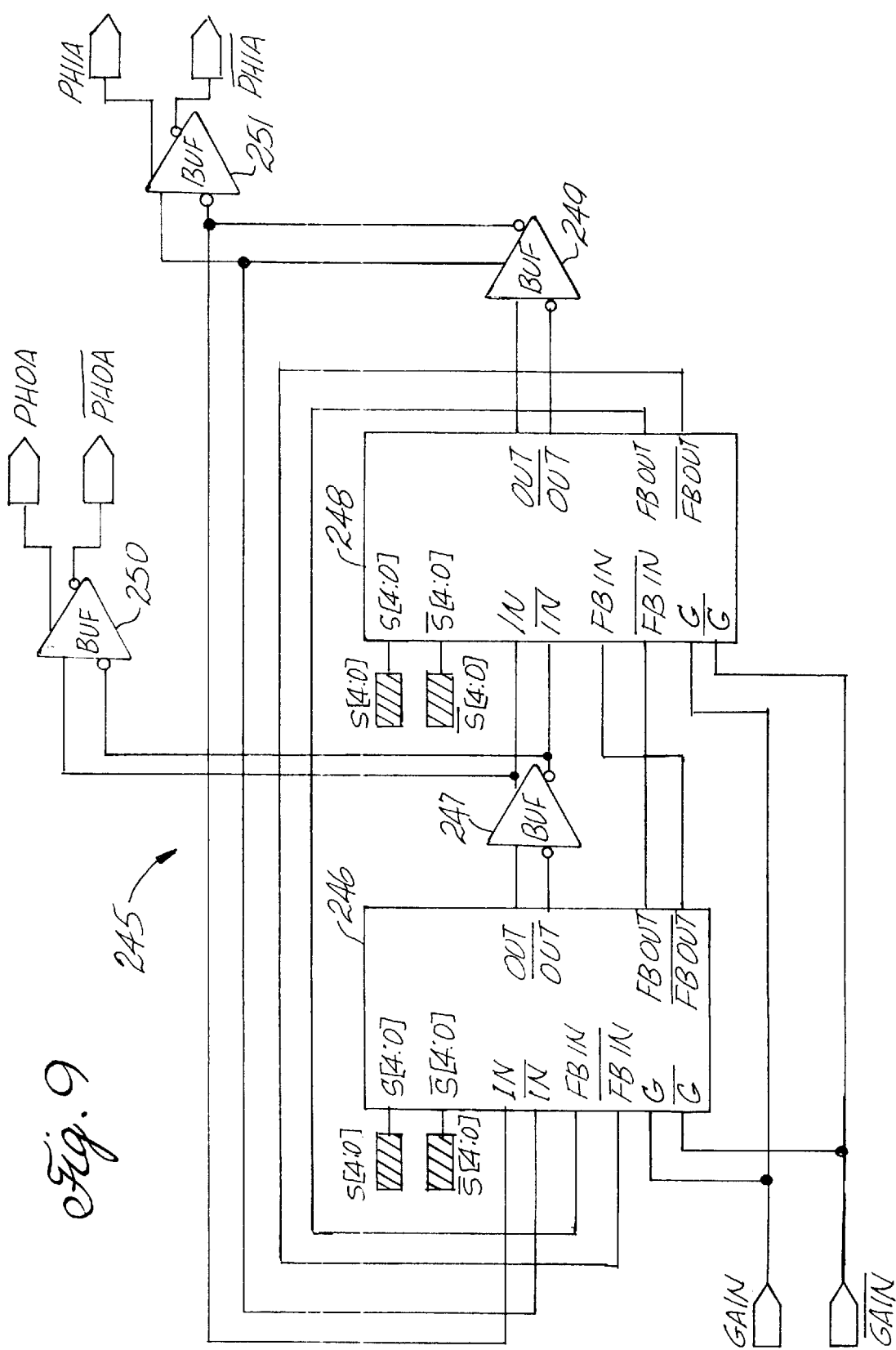
FIG. 9 illustrates a ring oscillator having oscillator stages with ranging.

FIG. 9 illustrates a block diagram of a ring oscillator 245 having two oscillator stages with ranging, 246 and 248. This ring oscillator with ranging comprises two oscillator stages 246 and 248, and two buffers 247 and 249. Buffers 250 and 251 are provided as output drivers. Two pairs of differential output signals of the oscillator stage with ranging 246, Out/$\overline{\text{OUT}}$ and FB Out/$\overline{\text{FB OUT}}$ are supplied as an input to a buffer 247, and as an inverted feedback input into the oscillator stage 248, respectively. A pair of differential output signals of the buffer 247, in turn, is supplied as an input to the oscillator stage 248. Two pairs of differential output signals, Out/$\overline{\text{OUT}}$ and FB Out/$\overline{\text{FB OUT}}$, of the oscillator stage 248, in turn, are supplied to the buffer 249 as an input and as a feedback input into the oscillator stage 246, respectively. Finally, to complete the ring, a pair of different output signals of the buffer 249 is supplied to the oscillator stage 246 as an inverted input. In addition, the time oscillator stages with ranging receive differential signals $S_0$–$S_4$ and $S_0$–S4. This is one embodiment of a ring oscillator with ranging.

Figure 10:
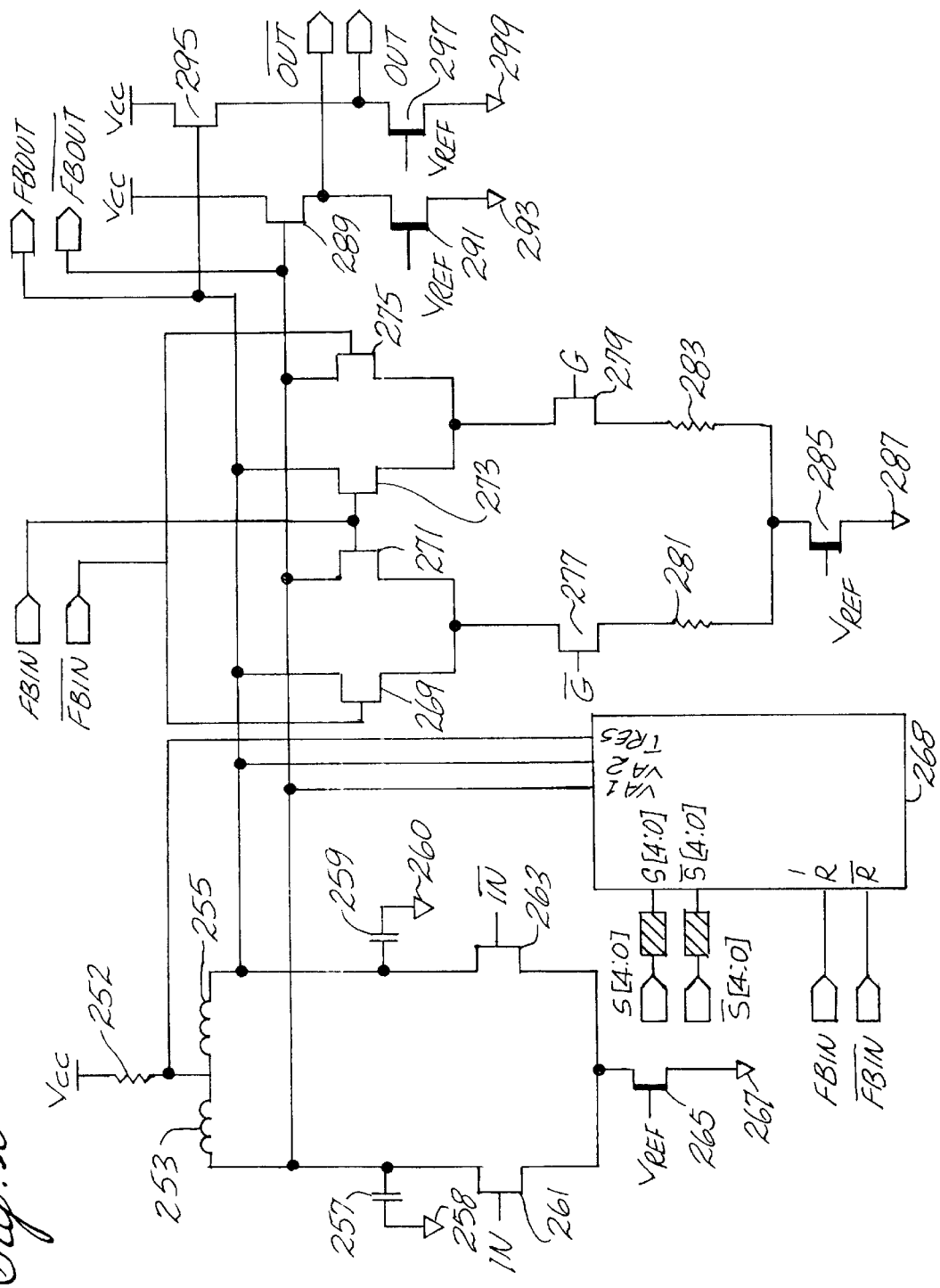
FIG. 10 illustrates the oscillator stage with ranging of the ring oscillator of FIG. 9.

FIG. 10 illustrates an oscillator stage with ranging 246 (248). A first end of a resistor 252 is coupled to Vcc. A second end of the resistor 252 is coupled to a first end of a first inductor 253 and a first end of a second inductor 255. A second end of the first inductor 253 is coupled to a first end of a first capacitor 257, and a second end of the second inductor 255 is coupled to a first end of a second capacitor 259. A second end of the first capacitor 257 and a second end of the second capacitor 259 are coupled to common 258 and 260, respectively. The first inductor 253 and the first capacitor 257 pair, and the second inductor 255 and the second capacitor 259 pair comprise LC tank circuits. The resistor 252 coupled between the LC tank circuits and Vcc is a biasing resistor for bringing down the reference voltage of operation of the LC tank circuit to below Vcc, shifting a common-mode operation voltage.

The second ends of the inductors 253 and 255 are also coupled to drains of transistors 261 and 263, respectively. Gates of the transistors 261 and 263 are used to input a pair of differential input signals, IN and $\overline{\text{IN}}$, respectively. IN and $\overline{\text{IN}}$ are inputs to the oscillator stage with ranging. Sources of the transistors 261 and 263 are coupled to a drain of a transistor 265. A source of the transistor 265 is coupled to a common 267. A gate of the transistor 265 is coupled to a reference voltage, $V_{REF}$.

The transistor 265 operates as a current source, and a current flowing through the transistor 265 is controlled only by $V_{REF}$. Therefore, if $V_{REF}$ remains fixed, the current flowing through the transistor 265 is substantially constant at all times of operation. Therefore, the differential input signals, IN and $\overline{\text{IN}}$, applied at the gates of the transistors 261 and 263, respectively, determine the ratio of $I_{DS}$ currents flowing respectively through transistor 261 and transistor 263.

Drains of transistors 269 and 273 are coupled to the second end of the second inductor 255, and drains of transistors 271 and 275 are coupled to the second end of the first inductor 253. Gates of the transistors 271 and 273 are coupled to FB IN signal from another oscillator stage in the ring. Gates of the transistors 269 and 275 are coupled to $\overline{\text{FB IN}}$ signal from said another oscillator stage in the ring. Sources of the transistors 269 and 271 are coupled to a drain of a transistor 277. Sources of the transistors 273 and 275 are coupled to a drain of a transistor 279.

Gates of the transistors 279 and 277 are coupled to a pair of differential gain control signals G and $\overline{\text{G}}$, respectively. Sources of the transistors 277 and 279 are coupled to first ends of resistors 281 and 283 respectively. Second ends of the resistors 281 and 283 are coupled to a drain of a transistor 285. A gate of the transistor 285 is coupled to $V_{REF}$. A source of the transistor 285 is coupled to a common 287.

The second ends of the inductors 253 and 255 are also coupled to gates of transistors 289 and 295 respectively. Signals from the second ends of the inductors 253 and 255 are fed into another oscillator stage of the ring oscillator as a pair of differential signals $\overline{\text{FB OUT}}$ are and FB OUT, respectively.

Drains of the transistors 289 and 295 are coupled to Vcc. Sources of the transistors 289 and 295 are coupled to drains of transistors 291 and 297, respectively. Gates of the transistors 291 and 297 are coupled to $V_{REF}$. Sources of the transistors 291 and 297 are coupled to common, 293 and 299, respectively. The sources of the transistors 289 and 295 are provided as a pair of differential output signals OUT and $\overline{OUT}$, and input into a buffer of the ring oscillator as a pair of differential signals IN and $\overline{IN}$. At the same time, the OUT and $\overline{OUT}$ signals are output signals of the ring oscillator. In the absence of a ranging circuit 268, the operation of the oscillator stage with ranging 246 (248) is identical to the oscillator stage 50 of FIG. 4.

A differential signals R and $\overline{R}$ of the ranging circuit 268 is coupled to the FB IN and $\overline{FB\ IN}$ signals from said another oscillator stage with ranging. The ranging circuit 268 is also coupled to differential ranging signals $S_0$-$S_4$ and $\overline{S_0}$-$\overline{S_4}$. $VA_1$, $VA_2$ and $T_{RES}$ signals of the ranging circuit are coupled to the second end of the first inductor 253, the second end of the second inductor 255 and the second end of the resistor 252, respectively.

Figure 11:
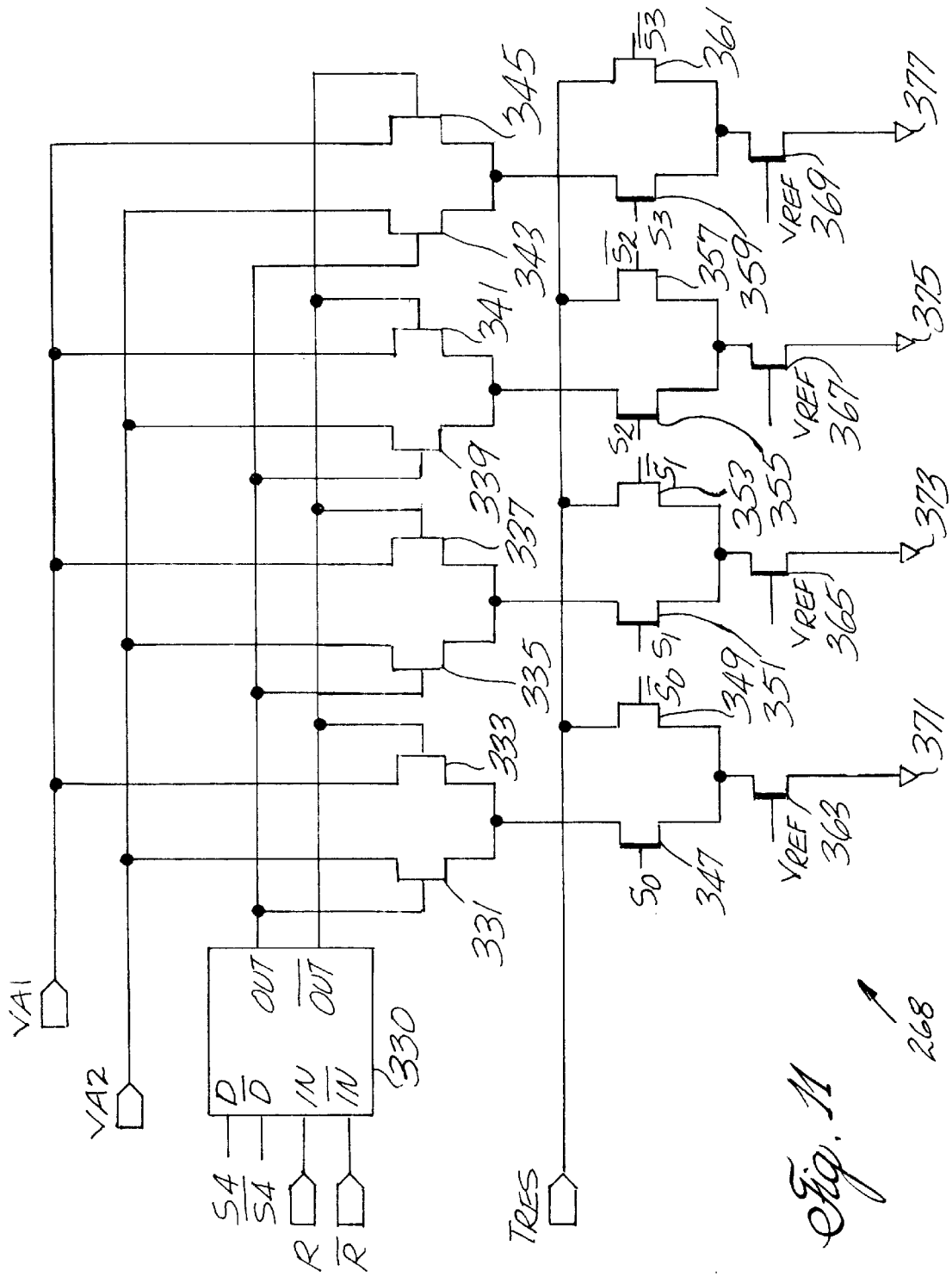
FIG. 11 illustrates the ranging circuit of the oscillator stage with ranging of FIG. 10.

FIG. 11 illustrates the ranging circuit 268 of the oscillator stage with ranging of FIG. 10. Drains of transistors 331, 335, 339 and 343 are coupled to the $VA_2$ signal which is from the second end of the second inductor 255 of FIG. 10. Drains of transistors 333, 337, 341 and 345 are coupled to the $VA_1$ signal which is from the second end of the first inductor 253 of FIG. 10. Gates of the transistors 331, 335, 339 and 343 are coupled to an OUT signal of a multiplexor circuit 330. Gates of the transistors 333, 337, 341 and 345 are coupled to an $\overline{OUT}$ signal of the multiplexor circuit 330. The multiplexor circuit 330 receives $S_4$ and $\overline{S_4}$ signals and FB IN and $\overline{FB\ IN}$ signals as D and $\overline{D}$ inputs and IN and $\overline{IN}$ inputs, respectively.

Sources of the transistors 331 and 333 are coupled to a drain of a transistor 347. Sources of the transistors 335 and 337 are coupled to a drain of a transistor 351. Sources of the transistors 339 and 341 are coupled to a drain of a transistor 355. Sources of the transistors 343 and 345 are coupled to a drain of a transistor 359. $T_{RES}$ signal from the second end of the resistor 252 of FIG. 10 is coupled to drains of transistors 349, 353, 357 and 361.

Gates of the transistors 347 and 349 receive a differential pair of range signals $S_0$ and $\overline{S_0}$, respectively. Gates of the transistors 351 and 353 receive a differential pair of range signals $S_1$ and $\overline{S_1}$, respectively. Gates of the transistors 355 and 357 receive a differential pair of range signals $S_2$ and $\overline{S_2}$, respectively. Gates of the transistors 359 and 361 receive a differential pair of range signals $S_3$ and $\overline{S_3}$, respectively.

Sources of the transistors 347 and 349 are coupled to a drain of a transistor 363. Sources of the transistors 351 and 353 are coupled to a drain of a transistor 365. Sources of the transistors 355 and 357 are coupled to a drain of a transistor 367. Sources of the transistors 359 and 361 are coupled to a drain of a transistor 369. Gates of the transistors 363, 365, 367 and 369 are coupled to the reference voltage, $V_{REF}$. Sources of the transistors 363, 365, 367 and 369 are coupled to common 371, 373, 375 and 377, respectively.

Currents flowing through the transistors 349, 353, 357 and 361 will not affect the magnitude of the feedback current supplied to the oscillator stage with ranging 246 (248). Instead, they allow currents to flow through the transistors 363, 365, 367 and 369, respectively, when the transistors 347, 351, 355 and 359 are turned off. Aside from the negative differential signals $\overline{S_0}$ through $\overline{S_3}$, which respectively control currents flowing through the transistors 349, 353, 357 and 361, the ranging circuit operates in much the same manner as a ranging portion of the oscillator with ranging 140 in FIG. 7 with one major difference.

Unlike the oscillator with ranging 140 of FIG. 7, the ranging circuit 268 of FIG. 11 uses an additional pair of differential signals, $S_4$ and $\overline{S_4}$. The $S_4$ and $\overline{S_4}$ signals are used as a sign for FB IN and $\overline{FB\ IN}$ signals to control a direction of a feedback current flow. In the ranging circuit 268, the feedback input signals FB IN and $\overline{FB\ IN}$ are XOR'd together with the $S_4$ signal prior to being applied at the gates of the transistors 331, 333, 335, 337, 339, 341, 343 and 345. Therefore, a polarity of the feedback current is determined by the $S_4$ and $\overline{S_4}$ signals in addition to a phase offset of the feedback input signals. Thus, in essence, $S_4$ operates as a sign signal to the rest of the range signals, $S_0$-$S_3$.

FIG. 12A illustrates a block diagram of the multiplexor circuit 330, which is used to implement XOR function with the feedback signals FB IN/$\overline{FB\ IN}$ and sign signals $S_4$/$\overline{S_4}$ to control the polarity of the feedback current. A multiplexor is used instead of an XOR circuit because of unacceptable delay which would result from using the XOR circuit.

Figure 12B:
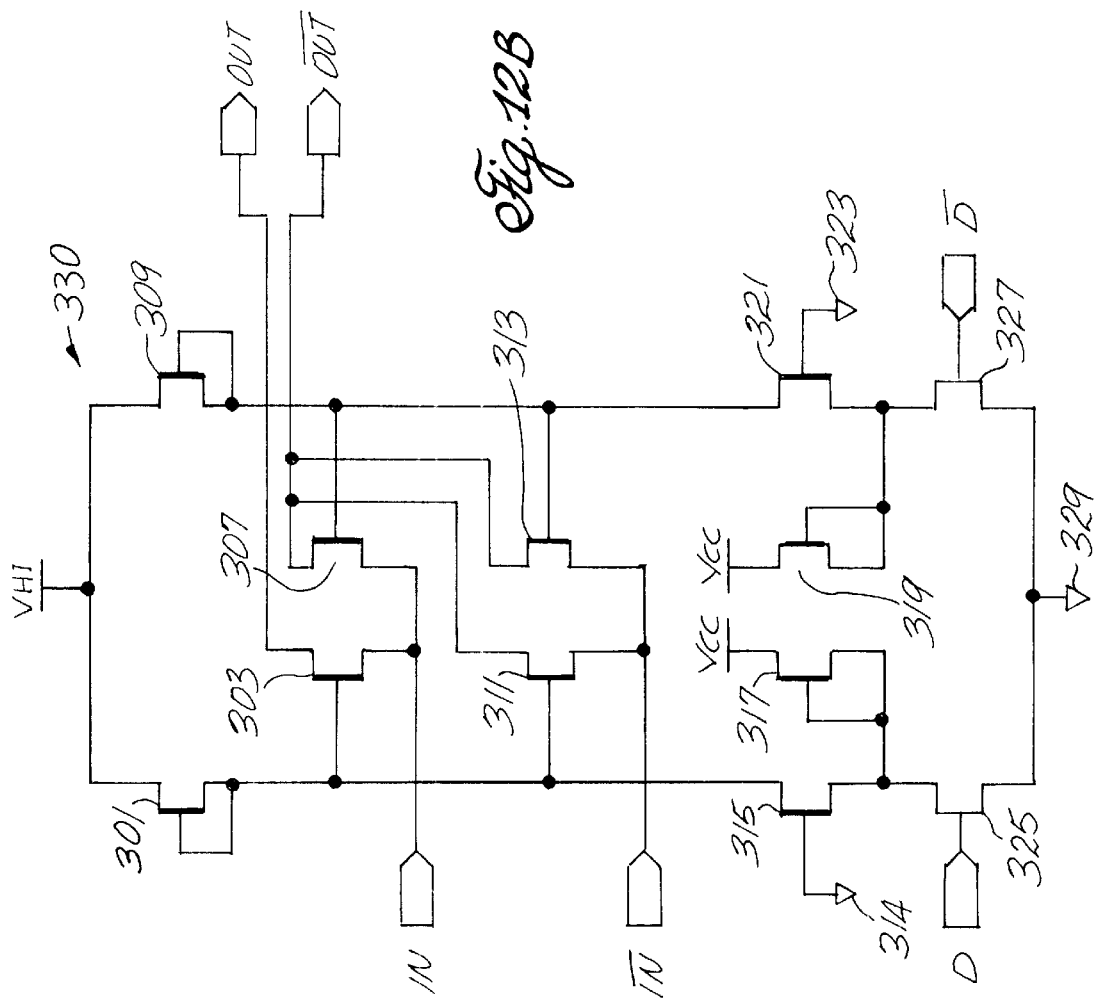
FIG. 12B illustrates the multiplexor circuit of the ranging circuit of FIG. 11.

FIG. 12B illustrates the multiplexor circuit 330. The multiplexor circuit 330 has a pass gate architecture where the sign signal $S_4$ or the inverse sign signal $\overline{S_4}$ is applied to each of the gates of transistors which take in IN signal or $\overline{IN}$ signal as an input. The output signals of the multiplexor circuit 330, OUT and $\overline{OUT}$ signals, represent logically XOR'd signals between the IN signal and the D ($S_4$) signal and between the $\overline{IN}$ signal and the D ($S_4$) signal, respectively.

In FIG. 12B, transistors 325 and 327 are EFETs, which operate in an enhanced mode. All other transistors in FIG. 12B are DFETS, which operates in a depletion mode. An $I_{DS}$ current doesn't flow through an EFET unless $V_{GS}$<0. On the other hand, an $I_{DS}$ current flow through a DFET as long as $V_{GS}$>Vp, where Vp is a pinch off voltage, which can be <0.

Drains of transistors 301 and 309 are coupled to a voltage source, $V_{HI}$. Gates of transistors 301 and 309 are coupled to their respective sources, thus the transistors 301 and 309 operate as diodes. The sources of the transistors 301 and 309 are also coupled to gates of transistors 303 and 307, respectively. Sources of the transistors 303 and 307 are coupled to the positive input signal IN, which is the positive feedback input signal, FB IN, from said another oscillator stage. The sources of the transistors 301 and 309 are also coupled to gates of transistors 311 and 313. Sources of the transistors 311 and 313 are coupled to the negative input signal $\overline{IN}$, which is the negative feedback input signal, $\overline{FB\ IN}$, from said another oscillator stage.

The sources of the transistors 301 and 309 are also coupled to drains of transistors 315 and 321, respectively. Gates of the transistors 315 and 321 are coupled to common 314 and 323, respectively. Sources of the transistors 315 and 321 are coupled to drains of transistors 325 and 327, respectively. Gates of the transistors 325 and 327 get input of the pair of differential sign signals D ($S_4$) and $\overline{D}$ ($\overline{S_4}$), respectively.

Sources of the transistors 325 and 327 are coupled to a common 329. The sources of the transistors 315 and 321 are also coupled to sources of transistors 317 and 319, respectively. The sources of the transistors 317 and 319 are also coupled to their respective gates, therefore, the transistors 317 and 319 operate as diodes. Drains of the transistors 317 and 319 are coupled to Vcc.

Accordingly, the present invention provides a voltage or current controlled oscillator with a wide tuning range. Although this invention has been described in certain specific embodiments, many additional modifications and variations would be apparent to those skilled in the art. It is therefore to be understood that this invention may be practiced otherwise than as specifically described. Thus, the present embodiments of the invention should be considered in all respects as illustrative and not restrictive, the scope of the invention to be determined by the appended claims and their equivalents rather than the foregoing description.

What is claimed is:

1. A controlled oscillator circuit receiving an input stimulus and generating an oscillating output signal comprising:
    an LC tank circuit having an inductive element and a capacitive element, the LC tank circuit receiving the input stimulus and providing the oscillating output signal;
    a current source element coupled to the LC tank circuit, the amplitude of a current flowing through the current source being controlled by a control signal applied to the current source element; and
    a phase shifting element coupled to the LC tank circuit and the current source element, said phase shifting element controlling a phase of the current flowing through the current source with respect to a phase of the oscillating output signal.

2. The controlled oscillator circuit of claim 1 wherein the phase shifting element shifts the phase of the current flowing through the current source element by approximately 90 degrees with respect to the phase of the oscillating output signal.

3. The controlled oscillator circuit of claim 1 wherein an oscillation frequency of the oscillating output signal is substantially linearly dependent on the amount of the current flowing through the current source element over a frequency range of operation of the controlled oscillator circuit.

4. The controlled oscillator circuit of claim 2 wherein an oscillation frequency of the oscillating output signal is substantially linearly dependent on the amount of the current flowing through the current source element over a frequency range of operation of the controlled oscillator circuit.

5. The controlled oscillator circuit of claim 1 wherein the input stimulus is provided by a voltage source.

6. The controlled oscillator circuit of claim 1 wherein the input stimulus is provided by a current source.

7. The controlled oscillator circuit of claim 2 wherein the phase shifting element is an integrator.

8. The controlled oscillator circuit of claim 2 wherein the phase shifting element is a differentiator.

9. The controlled oscillator circuit of claim 1 wherein the input stimulus is a differential stimulus.

10. The controlled oscillator circuit of claim 1 wherein the oscillating output signal is a differential signal.

11. A controlled oscillator circuit receiving an input stimulus and generating an oscillating output signal comprising:
    an LC tank circuit having an inductive element and a capacitive element, the LC tank circuit receiving the input stimulus and providing the oscillating output signal;
    a current source element coupled to the LC tank circuit; and,
    a phase shifting element coupled to the LC tank circuit and the current source element, said phase shifting element controlling a phase of a current flowing through the current source with respect to a phase of the oscillating output signal;
    wherein the phase shifting element shifts the phase of the current flowing through the current source element by approximately 90 degrees with respect to the phase of the oscillating output signal; and
    wherein the phase shifting element comprises:
        an RC circuit having a variable resistor and a capacitive element; and
        a phase detector coupled to the RC circuit, said phase detector comparing a phase differential between the phase of the current flowing through the current source and the phase of the oscillating output signal, and adjusting the variable resistor to keep the phase differential at approximately 90 degrees.

12. A controlled oscillator circuit comprising:
    a ring oscillator with a plurality of oscillator stages, each of said plurality of oscillator stages receiving an input signal, a plurality of range signals, and a feedback signal, a phase differential between the input signal and the feedback signal being approximately 90 degrees at each of said plurality of oscillator stages, each of the oscillator stages including a plurality of current sources coupled to an output of the oscillator stage, the phase of current flowing through the current sources being controlled by the feedback signal, and each of the current sources receiving differing ones of the plurality of range signals, the amplitude of current flowing through the current sources being controlled by the range signals.

13. The controlled oscillator circuit of claim 12, wherein the ring oscillator comprises:
    two oscillator stages; and
    two buffers.

14. A controlled oscillator circuit with ranging receiving an input stimulus and generating an oscillating output signal comprising:
    an LC tank circuit having an inductive element and a capacitive element, the LC tank circuit receiving the input stimulus and providing the oscillating output signal;
    a current source element coupled to the LC tank circuit;
    a phase shifting element coupled to the LC tank circuit and the current source element, said phase shifting element controlling a phase of a current flowing through the current source with respect to a phase of the oscillating output signal; and
    a ranging element receiving a plurality of range signals, each of which may be used independently to control an amount of all or a portion of a current flowing through the current source element.

15. The controlled oscillator circuit with ranging of claim 14 wherein the phase shifting element shifts the phase of the current flowing through the current source element by approximately 90 degrees with respect to the phase of the oscillating output signal.

16. The controlled oscillator circuit with ranging of claim 14 wherein an oscillation frequency of the oscillating output signal is substantially linearly dependent on the amount of the current flowing through the current source element over a frequency range of operation of the controlled oscillator circuit with ranging.

17. The controlled oscillator circuit with ranging of claim 15 wherein an oscillation frequency of the oscillating output signal is substantially linearly dependent on the amount of the current flowing -through the current source element over a frequency range of operation of the controlled oscillator circuit with ranging.

18. The controlled oscillator circuit with ranging of claim 14 wherein the input stimulus is provided by a voltage source.

19. The controlled oscillator circuit with ranging of claim 14 wherein the input stimulus is provided by a current source.

20. The controlled oscillator circuit with ranging of claim 15 wherein the phase shifting element is an integrator.

21. The controlled oscillator circuit with ranging of claim 15 wherein the phase shifting element is a differentiator.

22. The controlled oscillator circuit with ranging of claim 14 wherein the input stimulus is a differential stimulus.

23. The controlled oscillator circuit with ranging of claim 14 wherein the oscillating output signal is a differential signal.

* * * * *

UNITED STATES PATENT AND TRADEMARK OFFICE
CERTIFICATE OF CORRECTION

PATENT NO. : 6,232,844 B1
DATED : May 15, 2001
INVENTOR(S) : Ronald F. Talaga, Jr.

It is certified that error appears in the above-identified patent and that said Letters Patent is hereby corrected as shown below:

Column 4,
Line 48, replace "$\phi_n = 1\sqrt{LC}$" with -- $\omega_n = 1\sqrt{LC}$ --.
Lines 51 and 52, replace "$\omega_0 \pm A/2C + \sqrt{(A^2/4C^2 + \omega n_n^2)}$" with -- $\omega_0 = \pm A/2C + \sqrt{(A^2/4C^2 + \omega n_n^2)}$. --.
Line 54, replace "$\omega_0 \simeq \pm A/2C + \phi_n$" with -- $\omega_0 \simeq \pm A/2C + \omega_n$ --.
Line 55, replace "$\phi \simeq \pm pi/2$" with -- $\phi \simeq \pm pi/2$ --.
Line 65, replace "+pi/2or" with -- +pi/2 or --.

Column 5,
Line 67, begin a new paragraph with "The second".

Column 6,
Line 2, replace "and .211" with -- and 211 --.
Lines 2-3, "Gates of the transistors" should not begin a new paragraph.
Lines 2-3, should read: -- of transistors 209 and 211, respectively." Gates of the transistors 209 and 211 are used to input a --.

Column 10,
Line 8, replace "$S_o$—S4" with -- $S_0$-$S_4$ --.
Line 66, delete "are".

Column 12,
Line 34, replace "$V_{GS} < 0$" with -- $V_{GS} > 0$ --.

UNITED STATES PATENT AND TRADEMARK OFFICE
CERTIFICATE OF CORRECTION

PATENT NO. : 6,232,844 B1
DATED : May 15, 2001
INVENTOR(S) : Ronald F. Talaga, Jr.

It is certified that error appears in the above-identified patent and that said Letters Patent is hereby corrected as shown below:

Column 14,
Line 63, replace "-through" with -- through --.

Signed and Sealed this

Fourteenth Day of January, 2003

JAMES E. ROGAN
*Director of the United States Patent and Trademark Office*